United States Patent [19]

Baker

[11] 4,092,736
[45] May 30, 1978

[54] THREE ELECTRODE DYNAMIC SEMICONDUCTOR MEMORY CELL WITH COINCIDENT SELECTION

[76] Inventor: Roger Thomas Baker, Box 240, Mt. Tabor, N.J. 07878

[21] Appl. No.: 702,841

[22] Filed: Jul. 6, 1976

[51] Int. Cl.² .................. G11C 7/00; G11C 11/34
[52] U.S. Cl. ........................... 365/189; 307/238; 357/24; 365/183
[58] Field of Search ............. 340/173 R; 357/24; 307/238, 304

[56] References Cited

U.S. PATENT DOCUMENTS

| | | | |
|---|---|---|---|
| 3,720,922 | 3/1973 | Kosonocky | 340/173 CA |
| 3,755,793 | 8/1973 | Ho et al. | 340/173 R |
| 3,935,446 | 1/1976 | Michon | 357/24 X |
| 3,997,799 | 12/1976 | Baker | 340/173 CA |
| 4,000,418 | 12/1976 | Waldron et al. | 357/24 X |
| 4,015,247 | 3/1977 | Baker | 340/173 R |

OTHER PUBLICATIONS

Baertsch et al., A New Surface Charge Analog Store, IEEE IEDM, Wash., D.C., Dec. 3, 1973, pp. 134–137.
Tiemann et al., A Surface-Charge Correlator, IEEE Journal of Solid State Circuits, vol. SC-9, No. 6, 12/74, pp. 403–410.

*Primary Examiner*—Bernard Konick
*Assistant Examiner*—Donald McElheny

[57] ABSTRACT

A semiconductor random access memory is described in which the datum stored in one memory cell can be recalled without having to recall, temporarily store, and then re-enter the data stored in a column of memory cells. Datum can also be entered into one memory cell without having to recall and subsequently re-enter the data in a column of memory cells. During the recall and enter processes, only one of the normally off sense amps needs to be powered up. Compared to prior art one-transistor memories, this memory consumes less power and has a faster write cycle.

2 Claims, 6 Drawing Figures

THREE ELECTRODE DYNAMIC SEMICONDUCTOR MEMORY CELL WITH COINCIDENT SELECTION

BACKGROUND OF THE INVENTION

This invention relates generally to a method of operating semiconductor memory cells and in particular to a method of operating dynamic semiconductor memory cells with capacitive means for the storage of binary data.

In the prior art, one-transistor memory cells have been utilized in semiconductor memories to achieve maximum packing density. Such memories suffer from the disadvantages of being word organized — that is at the array level, data is delt with exclusively in columns. As a consequence, to either enter datum in one memory cell or to recall the datum from one memory cell, the data in a column of memory cells must first be recalled from the memory array. Then in the recall process, one bit from the plurality of bits recalled is selected and the data, including the bit of interest, which can be altered, is then re-entered in the memory cells. In the enter datum operation, data from a column of memory cells is first recalled and then together with the new datum, re-entered.

In both cases power consumption is relatively large since a large number of bits is being manipulated. Also the time required to enter a new datum is increased by the requirement of first recalling a column of data.

SUMMARY OF THE INVENTION

In the present invention, a memory cell of comparable size to the one-transistor memory cell is used to form a memory array in which one bit can be recalled from or entered in to one memory cell without having to recall the data in a column of memory cells.

This capability is achieved by replacing the diffused region which forms the source of the gate transistor in one-transistor memory cells with a recall electrode. The recall electrode is in proximity to a semiconducting substrate, and by applying an appropriate potential between the recall electrode and the semiconducting substrate, a second localized minimum potential energy region for mobile charge carriers of one polarity, hereinafter also called a recall potential well, can be formed in the semiconducting substrate. Like the one-transistor memory cell, the memory cell used in the present invention has a first electrode, hereinafter also called a storage electrode, in proximity to the semiconducting substrate. In the semiconductor generally beneath the storage electrode, a first localized minimum potential energy region for said polarity of mobile charge carriers, hereinafter also called a storage potential well is formed by applying an appropriate potential between the storage electrode and the semiconducting substrate. The density or number of mobile charge carriers of said polarity which are stored in the storage potential well is used to represent binary datum. A gate electrode in proximity to the semi-conducting substrate is used to establish in the semiconducting substrate generally beneath the gate electrode, a third localized minimum potential energy region for said polarity of mobile charge carriers, which hereinafter is also called the gate potential well or channel, by applying an appropriate potential between the gate electrode and the semiconducting substrate. When the recall potential well for a particular memory cell is established, the gate potential well of that memory cell provides a channel between the storage potential well of that memory cell and the recall potential well of that memory cell, so that mobile charge carriers of said polarity can exit from the storage potential well in to the recall potential well, or mobile charge carriers of said polarity can be transferred from the recall potential well in to the storage potential well. But in the memory cell used in the present invention, forming a gate potential well in a memory cell in which a recall potential well has not been formed only causes some of the mobile charge carriers which may be stored in the storage potential well to transfer to the gate potential well. Then when the gate potential well is appropriately extinguished, most of any carriers which had transferred from the storage potential well to the gate potential well will return to the storage potential well. Therefore, the datum in a memory cell is not destroyed by activating just it's gate electrode.

By appropriate disposition of and interconnection of the electrodes of a plurality of memory cells to form a memory array, during the recall and enter datum processes, only one memory cell has both it's gate electrode and it's recall electrode activated.

In many applications, a memory comprised of such memory cells and operated according to the methods of this invention has increased reliability compared to prior art one-transistor type memories. This enhanced reliability is achieved because each bit is subject to less manipulation, and in systems with error correction capability, each time a bit is recalled from the memory (except during refreshing), it's validity can be verified before re-entering it. In one-transistor memories, only the one selected bit can be verified before re-entry. The other recalled bits in the same column as the selected bit cannot be easily verified.

Accordingly, it is an object of this invention to provide a method of operating dynamic memory cells which can be implemented using a memory cell requiring minimized semiconductor surface area.

It is another object of this invention to provide a method of operating a memory which minimizes power consumption, particularly in the enter and recall processes.

It is another object of this invention to provide a method of operating a memory which minimizes the time interval required to enter datum in a selected memory cell.

It is another object of this invention to provide a method of operating a memory which can be used in systems provided with error correction, to provide maximum reliability.

In the following more detailed description of the preferred embodiments of this invention, these and other objects, features, and advantages of the present invention will be demonstrated.

DESCRIPTION OF THE PREFERRED EMBODIMENTS

Figure 1:
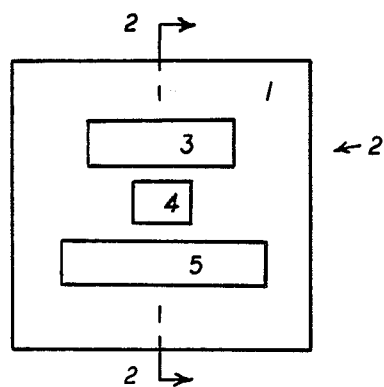
FIG. 1 is a top view of a memory cell which can be operated according to the methods of this invention.
Figure 2:
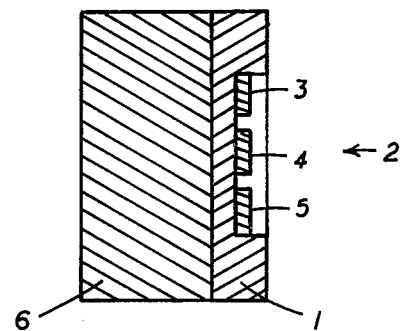
FIG. 2 is a cross-sectional view taken along line 2—2 of FIG. 1.

In FIG. 1, a top view of one memory cell 2 is shown. In the figure, the insulating layer 1, the storage electrode 3, the gate electrode 4, and the recall electrode 5 are shown. In FIG. 2, a cross-sectional view taken along line 2—2 of FIG. 1 shows that the storage, gate and recall electrodes 3, 4, 5 are separated from the semiconducting substrate 6 by a relatively thin layer of insulating material 1.

To facilitate understanding of the figures, reference numerals have been assigned according to the following conventions. Elements which appear in a particular figure which are substantially identical to elements which appear in a previous figure are identified by the same reference numerals that were used for the elements in their first appearance. An element in a particular figure which is a modification of an element which appears in a previous figure is identified by the same reference numeral that was used for the element in it's first appearance, but the reference numeral will be primed when referring to the modified element.

Figure 3:
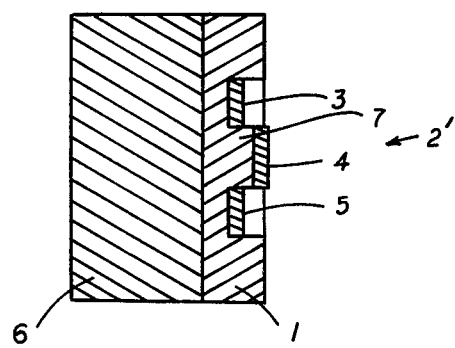
FIG. 3 is a cross-sectional view of an alternative memory cell which can be operated according to the methods of this invention.

The memory cell 2' shown in cross-section in FIG. 3 differs from the memory cell 2 shown in FIGS. 1 and 2 only in that a thicker layer of insulating material 7 is used beneath the gate electrode 4 than is used beneath the storage and recall electrodes 3, 5.

Figure 4:
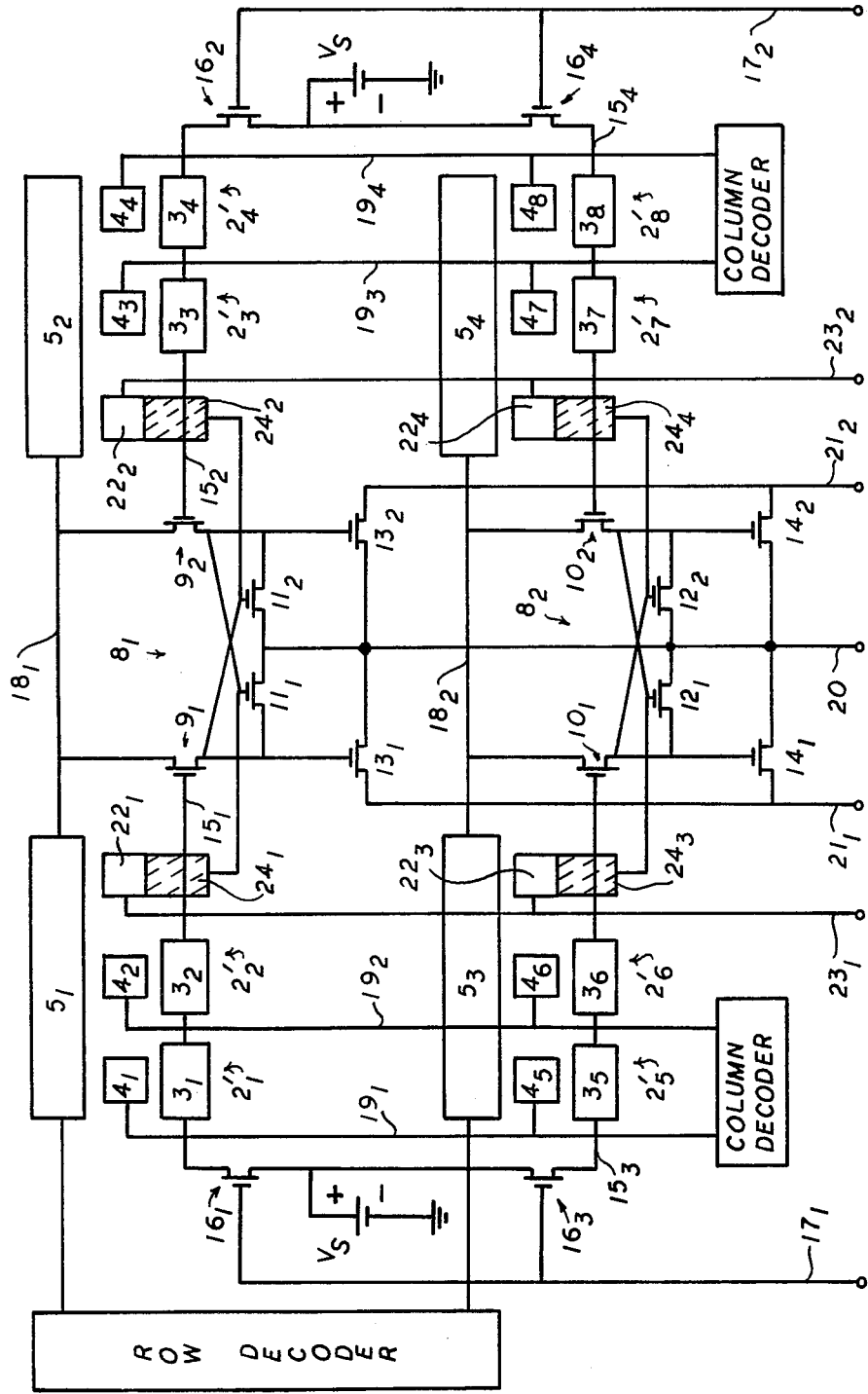
FIG. 4 is a schematic of a memory which can be operated according to the methods of the present invention.

FIG. 4 shows a schematic diagram of a memory comprised of eight memory cells $2_1', 2_2', \ldots 2_8'$. Each memory cell 2' consists of a storage electrode $3_1, 3_2, \ldots 3_8$, a gate electrode $4_1, 4_2, \ldots 4_8$, and a recall electrode $5_1, 5_2, 5_3, 5_4$. The memory cells 2' are disposed in two rows and four columns. Memory cells $2_1', 2_2', 2_3',$ and $2_4'$ appear in the first row and memory cells $2_5', 2_6', 2_7',$ and $2_8'$ appear in the second row. Memory cells $2_1'$ and $2_5'$ appear in the first column, memory cells $2_2'$ and $2_6'$ appear in the second column, memory cells $2_3'$ and $2_7'$ appear in the third column, and memory cells $2_4'$ and $2_8'$ appear in the fourth column. The sense amps $8_1, 8_2$ for each row appear in the center of each row. Each sense amp $8_1 (8_2)$ is a flip-flop and consists of two load transistors $9_1, 9_2 (10_1, 10_2)$, two cross coupled driver transistors $11_1, 11_2 (12_1, 12_2)$, and two sense transistors $13_1, 13_2 (14_1, 14_2)$. The sense amps 8 divide both the rows in to a left and right subrow. The memory cells 2' in each subrow have their storage electrodes 3 connected in common by means of one of the row lines $15_1, 15_2, 15_3, 15_4$, and each row line 15 is connected to the gate of one of the load transistors 9, 10 and to the source of one of the access transistors $16_1, 16_2, 16_3, 16_4$. The drain of each of the access transistors 16 is connected to the positive terminal of the potential source $V_s$. The negative terminal of $V_s$ is grounded. The gate of each of the access transistors 16 is connected to one of the gate control lines $17_1, 17_2$.

The memory cells 2' in each subrow share a common recall electrode 5 and the recall electrodes 5 which are in the same row are connected in common by buses $18_1, 18_2$. Buses $18_1 (18_2)$ are connected to the drains of the load transistors 9 (10). The recall electrodes 5 in each row are connected to the row decoders.

The gates 4 of the memory cells 2' in the same column are connected in common by means of the column lines $19_1, 19_2, 19_3, 19_4$, and the column lines 19 are connected to the column decoders.

The sense transistors 13, 14 have their sources connected in common with the sources of the driver transistors 11, 12 by means of the source bus 20. The gates of the sense transistors 13, 14 are connected to the drains of the driver transistors 11, 12. The drains of the sense transistors 13, 14 are connected to the output buses $21_1, 21_2$. A control electrode $22_1, 22_2, 22_3, 22_4$ is provided for each subrow of memory cells and the control electrodes 22 are connected to the control lines $23_1, 23_2$. Likewise each subrow of memory cells 2 is provided with a diffused region $24_1, 24_2, 24_3, 24_4$ each of which is connected to the gate of one of the driver transistors 11, 12.

Figure 5:
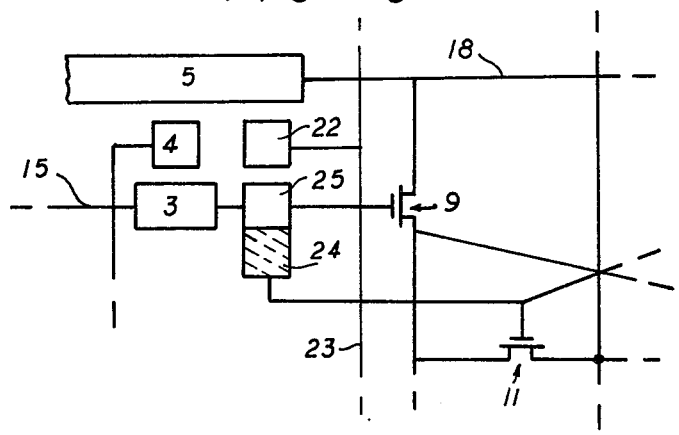
FIG. 5 is a schematic of a portion of a memory showing a first variation of the memory shown in FIG. 4.

If silicon gate technology is used to manufacture the memory shown in FIG. 4, the storage electrodes 3 and the row lines 15 are formed from the first polysilicon layer. However, using conventional silicon gate technology, it is impossible to form a diffused region beneath a first polysilicon layer and therefore the structure shown in FIG. 4 in which the diffused regions 24 pass beneath the row lines 15 must be modified. In FIG. 5 a modification to overcome this difficulty is shown. In the figure, a second gate 25 is placed between the diffused region 24 and the control electrode 22. The second gate 25 is connected to the row line 15, and together with the control electrode 22 is used to form a channel for mobile carriers from the diffused region 24.

Figure 6:
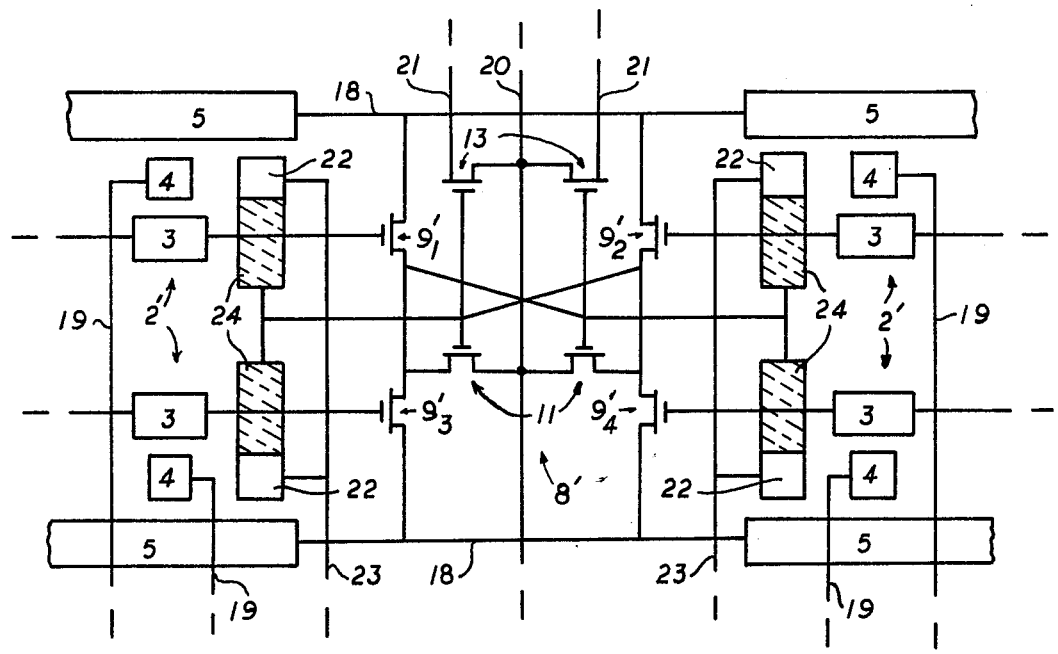
FIG. 6 is a schematic of a portion of a memory showing a second variation on the memory shown in FIG. 4.

FIG. 6 shows how the number of memory cells served by one sense amp can be increased by providing four load transistors $9_1', 9_2', 9_3', 9_4'$ per sense amp. This modification will be explained in more detail after the operation of the circuit shown in FIG. 4 has been described.

The memory cells whose operation is the subject of the present invention can be constructed by processes which are well known in the semiconductor integrated circuit art, and in particular in the MOS transistor and CCD arts. Therefore, except for special considerations peculiar to the memory cells used in this invention, the method of manufacture and the materials used in the manufacture of a memory operated according to the present invention will not be described.

As is evident from the summary of the invention, the memory cells used in this invention are charge transfer devices and therefore there are limits on the maximum spacing between adjacent electrodes which are used in transferring charge. These requirements are well known in the CCD art. However, while most charge transfer devices operate such that charge transfer efficiencies greater than 99% must be achieved, in memory cells used in the present invention, significantly lower transfer efficiencies are acceptable. Therefore interelectrode spacings somewhat larger than are usually used in CCD devices can be used in these memory cells.

In the interest of brevity, in the following detailed description of the operation of the memory cell shown in FIGS. 1 and 2, it will be assumed that the semiconducting substrate 6 is P type silicon doped to give a conductivity of about 4 ohm-cm., that the insulating layer 1 is silicon dioxide of about 12,000 A in the thick (field) regions and about 1000 A in the thin regions beneath the storage, gate, and recall electrodes 3, 4. 5. Also, the flat band voltage for the storage, gate and recall electrodes, 3, 4, 5 is assumed to be zero, so that when a particular one of these electrodes is at the same potential as the semiconducting substrate 6, no potential well is formed in the semiconducting substrate 6 beneath that particular electrode. Although this is a rather unrealistic assumption, it simplifies the description of the operation of the memory cell 2, and is commonly used for such purposes in the semiconductor arts literature. After reading and understanding the description of this invention, those skilled in the art can readily understand the operation of a memory in which the above assumption is not valid.

It is understood that this invention is not limited to the operation of this particular type of memory cell. Other semiconducting materials, semiconducting materials of different conductivity, and different conductivity type, and other insulating materials in different thicknesses can be used in memory cells which can be operated according to the methods of this invention.

The operation of the memory cell 2 shown in FIGS. 1 and 2, according to this invention is as follows. To retain datum in the memory cell 2, a potential $V_s$ — typically about 12 volts — is maintained on the storage electrode 3 and the semiconducting substrate 6 is maintained at ground potential. The potential $V_s$ applied to the storage electrode 3 forms a potential well — the storage potential well — for mobile electrons in the semiconducting substrate 6 generally beneath the storage electrode 3. The gate and recall electrodes 4, 5 are maintained at ground potential. For the specific memory cell 2 under consideration, the density of mobile electrons stored in the storage potential well is used to represent the datum stored in the memory cell 2. Let a relatively large density of mobile electrons in the storage potential well represent a one and a relatively small density of electrons in the storage potential well represent a zero. Since the gate electrode 4 is at ground potential any electrons in the storage potential well are confined thereto.

There are two methods by which the datum stored in the memory cell 2 can be recalled. In the first method, the potential source $V_s$ is removed from the storage electrode 3, leaving that electrode at the potential $V_s$, and means for detecting any voltage change on the storage electrode 3 is connected to the storage electrode 3. Said means for detecting changes in the potential on the storage electrode 3 will be referred to hereinafter as a sense amp. Then potential $V_g$ — typically about 12 volts — is applied to the gate electrode 4 and the potential $V_r$ — typically about 12 volts — is applied to the recall electrode 5. As a result of applying these potentials to the gate and recall electrodes 4, 5, potential wells are formed beneath these electrodes such that some of the electrons which were previously stored in the storage potential well transfer to the gate and recall potential wells. This charge transfer induces a voltage V on the storage electrode 3 which is given by $$V = (qN_a/2\epsilon_s)(X_r^2 - X_i^2)(1 + C_1/A_sC_{ox})^{-1} \quad \text{(Eq. 1)}$$

where $q$ = the electronic charge (1.6 × 10$^{-19}$ Coulombs)
$N_a$ = the net density of acceptors per cm$^3$ in the semiconductor substrate 6 in the vicinity of the storage potential well
$\epsilon_s$ = the dielectric constant of silicon
$X_r$ = The extent of the deep depletion region of the storage potential well in the direction perpendicular to the silicon - silicon dioxide interface, following the said transfer of electrons (in cm.)
$X_i$ = the extent of the deep depletion region of the storage potential well in the direction perpendicular to the silicon-silicon dioxide interface, just prior to the said transfer of electrons (in cm.)
$C_1$ = capacitive load on the storage electrode 3 (in Farads)
$A_s$ = area of the storage electrode 3 (in cm$^2$)
$C_{ox}$ = specific capacitance of the insulating layer 1 beneath the storage electrode 3 (in Farads/cm$^2$)

When a one is stored in the memory cell 2, $X_i$ is relatively small compared to the value of $X_i$ when a zero is stored in the memory cell 2. Therefore the potential change on the storage electrode 3 is larger if a one is stored therein then if a zero is stored therein. The potential change on the storage electrode 3 is detected by the sense amp, and a relatively large potential change indicates a one was stored in the memory cell 2 and a relatively small potential change indicates that a zero was stored in the memory cell 2.

In the second method of recalling the datum stored in the memory cell 2, the same procedure used in the first method is followed, except that the potential which is applied to the gate electrode 4 is selected such that if a zero is stored in the memory cell 2 essentially no electrons transfer from the storage potential well, while if a one is stored in the memory cell 2 a relatively large number of electrons are transferred from the storage potential well of the memory cell 2. Specifically, with $V_s$ on the storage electrode 3, if $X_0$ is the extent of the deep depletion region of the storage potential well when a zero is stored therein, and with $V_s$ on the storage electrode 3, if $X_1$ is the extent of the depletion region of the storage potential well when a one is stored therein, then $X_1$ is less than $X_0$. The potential $V_g'$ is selected so that when it is applied to the gate electrode 4 and there are essentially no electrons in the gate potential well, the extent of the deep depletion region beneath the gate electrode 4 is greater than $X_1$ but less than $X_0$. So if a zero is stored in memory cell 2, when $V_g'$ is applied to the gate electrode 4 and $V_r$ applied to the recall electrode 5, essentially no electrons will flow from the storage potential well, and the extent of the storage potential well will be unchanged. Therefore according to equation 1 there will be no voltage change on the storage electrode 3. If a one is stored in the memory cell 2, when $V_g'$ is applied to the gate electrode 4 and $V_r$ applied to the recall electrode 5, some electrons will flow from the storage potential well and the extent of the depletion region beneath the storage electrode 3 will increase. Therefore according to equation 1 the voltage on the storage electrode 3 will be increased. Again the sense amp is used to detect the potential change on the storage electrode 3. If there is no voltage change, or only a very small voltage change on the storage electrode 3 which can be attributed to capacitive coupling between the storage electrode 3 and other active electrodes in the vicinity of the storage electrode 3, such as the gate electrode 4, a zero was stored in the memory cell 2. If there is a relatively large potential change on the storage electrode 3, it indicates that a one was stored in the memory cell 2.

Which of these two methods of recalling the datum stored in the memory cell 2 is used depends in part on the characteristics of the sense amp and in practical embodiments, on other system considerations.

Note that with either technique of recalling datum from the memory cell 2, the potential $V_g$ or $V_g'$ need only be applied to the gate electrode 4 for a time interval sufficient for the transfer of electrons from the storage potential well to occur. Then the gate electrode 4 can be grounded and the output signal will remain on the storage electrode 3 until it decays away thru the leakage resistance of the storage electrode 3 and the input resistance of the sense amp. This is an important consideration in the operation of an array of memory cell 2.

The requirements on the area of the storage, gate and recall electrodes 3, 4, 5 and the magnitude of the potentials $V_s$, $V_r$, and $V_g$ or $V_g'$ to maximize the difference between the zero and one output signals will be considered when the operation of a complete memory is described.

The recall operation destroys the datum stored in the memory cell 2, and the enter process can be used to re-enter the datum.

To enter datum in the memory cell 2, the potential $V_g$ is applied to the gate electrode 4, the potential $V_r$ is applied to the recall electrode 5, the potential $V_s$ is maintained on the storage electrode 3, and the semiconducting substrate 6 is maintained at ground. Then to enter a one in the memory cell 2, a relatively large number of electrons are entered in to the recall potential well. Regardless of the number of electrons previously in the storage potential well, a relatively large number of electrons will now accumulate therein. To enter a zero, most of any electrons in the recall potential well are extracted therefrom. Regardless of the number of electrons previously in the storage potential well, a relatively small number of electrons are now stored therein. Then, whether entering a one or a zero, the gate electrode 4 is grounded, any excess electrons in the recall potential well are extracted therefrom, and then the recall electrode 5 is grounded. The memory cell 2 is now in the data retention mode, and the entered datum is stored in the memory cell 2.

The enter datum process will be considered in more detail when the operation of a complete memory is considered.

When the memory cell 2 is in the data retention mode, because of leakage currents, and the thermal generation of electrons near and within the storage potential well, an empty storage potential well tends to accumulate electrons. Therefore stored zeros tend to become lost. To avoid the loss of datum, the memory cell 2 must be periodically refreshed by recalling the datum stored therein, and then re-entering the datum. Note that the first method of recalling datum automatically enters a zero in the memory cell 2.

In practical semiconductor memories, sense amps, decoding circuits, input and output circuits, and timing circuits are often included on the same semiconducting substrate on which the memory cells are formed. For semiconductor memories which can be operated according to the methods of this invention, such additional circuitry will usually include a plurality of field effect transistors (FETs). If the memory is manufactured using current silicon technology, then especially when N channel FETs are used, it is often desirable to bias the semiconducting substrate so that the threshold voltage of the FETs are in a useful range. The use of a substrate bias also decreases the capacitive loading of the output signal from a memory cell 2 when datum is recalled.

If the memory cell 2 shown in FIGS. 1 and 2 is used in a memory in which a substrate bias is used, then even when the recall and gate electrodes 4, 5 are at ground potential, potential wells will be formed beneath these electrodes. The potential wells that exist beneath the gate and recall electrodes 4, 5 when these electrodes are at ground potential and a bias is applied to the semiconducting substrate 6, will be termed the residual gate and residual recall potential wells, respectively. When the memory cell 2 is in the data retention mode, electrons which are thermally generated near and within the residual gate and the residual recall potential wells can flow in to the storage potential well. This can significantly reduce the time interval that datum can be stored in the memory cell 2 before it must be refreshed. To minimize the flow of electrons in to the storage potential well, the gate region of the memory cell 2 can be modified so that, provided that the electron density in the residual recall potential well is kept low, few if any electrons will flow from the residual recall potential well in to the storage potential well.

In particular, the gate region of the memory cell 2 should be designed such that when a substrate bias is applied, the storage electrode 3 is at potential $V_s$, and both the gate and the recall electrodes 4, 5 are at or near ground potential, there is an energy barrier established in the semiconducting substrate 6 generally beneath the gate electrode 4 such that, provided that the electron density in the residual recall potential well is kept sufficiently low, electrons cannot flow from the residual recall potential well in to the storage potential well. Any of the parameters which affect the surface potential beneath an electrode can be varied to provide for such a barrier. Assuming that electrons are used to represent data, any of the following methods can be used.

First, the semiconducting substrate 6 generally beneath the gate electrode 4 can be doped with a higher density of acceptors than there are in the semiconducting substrate 6 generally beneath the recall electrode 5. Ion implantation can be used to establish this difference in doping density.

Second, the gate electrode 4 can be made of a material that has a larger work function than does the material used for the recall electrode 5.

Third, the positive charge density in the insulating material 1 beneath the gate electrode 4 can be made smaller than the positive charge density in the insulating material 1 beneath the recall electrode 5, by for example, selectively bombarding the insulating material 1 with high energy ions or radiation.

Fourth, the insulating material 1, or combinations of insulating materials used beneath the gate electrode 4 can be selected so that the effective dielectric constant of the insulating layer beneath the gate electrode 4 is less than the dielectric constant of the insulating layer beneath the recall electrode 5.

Fifth, a small positive potential can be maintained on the recall electrode 5 during data retention.

Sixth, as shown in FIG. 3, a thicker layer of insulating material 7 can be used beneath the gate electrode 4 than is used beneath the recall electrode 5.

Any one of these techniques, or any combination of them can be used to establish the above mentioned energy barrier. Analogous techniques can be used if data is represented by holes instead of electrons. All of these techniques are well known in the semiconductor art and will not be described in detail here.

The memory cells which are formed when the memory cell 2 of FIG. 1 and 2 is modified using any of the above techniques can be operated in a manner very similar to that described for the memory cell 2. The memory cell 2' shown in FIG. 3 is used in the memory shown in FIG. 4 and it's operation will be described when the operation of the memory is described.

Operation of a memory according to the methods of this invention will be described using the memory shown in FIG. 4 as an example. Practical memories will usually contain several thousand memory cells, but from the description of the memory shown in FIG. 4 those familiar with the semiconductor arts can readily understand the operation of much larger memories.

It will be assumed that a P type silicon substrate is used in the memory shown in FIG. 4, that all the field effect transistors are N channel devices, and that a substrate bias of between $-1$ and $-5$ volts is used to insure that the FETs are ehnancement mode devices with a nominal one volt threshold voltage. The memory cell $2'$ shown in FIG. 3 is used in the memory of FIG. 4.

In the data retention mode, the potential $V_s$ — typically about 10 volts — is applied to all the storage electrodes 3 by turning on all the access transistors 16. For reasons that will become apparent when the recall operation is described, it is important to minimize the difference between the potentials on the storage electrodes 3 of the memory cells $2'$ in the left and right subrows of each row. To prevent the variations in the threshold voltages of the access transistors 16 from introducing variations in the voltage applied to the storage electrodes 3, the access transistors 16 are maintained in the triode region by applying a potential greater than $V_s + V_{th}$, where $V_{th}$ is the threshold voltage of the access transistors 16, to the gate control lines 17.

In the data retention mode, the row decoder circuits maintain all the recall electrodes 5 at ground potential, and the column decoder circuits maintain all the gate electrodes 4 at ground potential. The source bus 20 and the output buses 21 are maintained at ground potential. The control lines 23 are maintained at a potential $V_c$ — about 12 volts — to form a potential well beneath the control electrodes 22. In this example, the diffused regions 24 and N type regions formed in the silicon substrate by selective diffusion of a suitable dopant such as phosphorous.

The drains of the load transistors 9, 10 are maintained near ground potential because the recall electrodes 5 are grounded. With the potential $V_s$ on the gates of the load transistors 9, 10 the load transistors 9, 10 are on and the sources of load transistors 9, 10 and also the diffused regions 24 are maintained near ground potential. With the diffused regions 24 grounded, the potential wells beneath the control electrodes 22 form channels for electrons from the residual recall potential well to the diffused regions 24, and electrons are continuously extracted from the residual recall potential wells. The surface potential of the recall potential wells is pinned near ground potential and therefore the concentration of electrons in the residual recall potential wells is kept sufficiently low that few electrons transfer from the residual recall potential well to the storage potential well while the memory is in the data retention mode.

All operations on the memory start with and end with the memory in the data retention mode.

For the memory shown in FIG. 4, to recall the datum stored in a particular memory cell $2'$ it is convenient to use the first method of recalling datum that was described when the operation of the single memory cell 2 shown in FIGS. 1 and 2 was considered. As an example, suppose the datum in the memory cell $2'_6$ is to be recalled. Then because the memory cell $2'_6$ is on the left side of the sense amps 8, access transistors $16_1$ and $16_3$, which are on the left side of the sense amps 8, are turned off by grounding the gate control line $17_1$. Due to the gate-source capacitive coupling of the access transistors $16_1$ and $16_3$, the potential on storage electrodes $3_1$, $3_2$, $3_5$ and $3_6$, which are on the left of the sense amps 8, decreases from $V_s$ to $V_s - V_a$, where $V_a$ is much less than $V_s$. The access transistors $16_2$ and $16_4$, which are on the right side of the sense amps 8, are maintained on, and the potential on the storage electrodes $3_3$, $3_4$, $3_7$, and $3_8$, which are on the right side of the sense amps 8, remains at $V_s$.

Next, the address of memory cell $2'_6$ is entered in to the row and column decoders, the control lines 23 are grounded, and the source bus 20 is brought from ground to potential $V_h$ — typically about 12 volts. Then the row decoder applies the potential $V_r$ — typically about 12 volts — to the recall electrodes $5_3$ and $5_4$ which are in the same row as memory cell $2'_6$. Since bus $18_2$ is also charged to potential $V_r$, power is applied to sense amp $8_2$ which serves the memory cell $2'_6$. Sense amp $8_1$ remains dormant.

The gates of the load transistors $10_1$ and $10_2$ are at potentials $V_s - V_a$ and $V_s$, respectively, and since the sources of these transistors are near ground, the load transistors 10 turn on and begin to charge up the capacitive loads at the sources of the load transistors 10. The time required to charge up the sources of the load transistors 10 is minimized by maintaining the driver transistors 12 off by keeping the sources bus 20 high.

Then the column decoder circuit applies the potential $V_g$ — typically about 12 volts — to column line $19_2$ and therefore to gate electrodes $4_2$ and $4_6$. Some of any electrons which were stored in the storage potential well of memory cell $2'_6$ transfer to the gate and recall potential wells. If a one was stored in memory cell $2'_6$, by the process that was described when the single memory cell 2 of FIGS. 1 and 2 was considered, the potential on the storage electrode $3_6$ rises from $V_s - V_a$ to $V_s - V_a + V_l$. The memory is designed and operated such that $V_s - V_a + V_l$ is greater than $V_s$. Now the gate of load transistor $10_1$ is at a slightly higher potential than the gate of load transistor $10_2$, which is at potential $V_s$. Therefore by source follower action, a similar potential difference is established at the sources of the load transistors 10. Next source bus 20 is brought to ground potential and by regenerative action, as the driver transistors 12 begin to conduct, the sense amp $8_2$ settles in to the stable stage in which driver transistor $12_1$ is "off" and driver transistor $12_2$ is "on". In this state, the gate of sense transistor $14_1$ is high and the gate of sense transistor $14_2$ is low. Therefore sense transistor $14_1$ is "on" and sense transistor $14_2$ is "off". The state of the sense transistors 14 is detected by applying a potential to the output buses 21.

If a zero was stored in memory cell $2'_6$, then following the transfer of electrons from the storage potential well, the potential on the storage electrode $3_6$ rises from $V_s - V_a$ to $V_s - V_a + V_0$. The memory is designed and operated such that $V_s - V_a + V_0$ is less than $V_s$. Therefore the gate of load transistor $10_2$ is at a slightly higher potential than the gate of load transistor $10_1$, and a similar potential difference is established at the sources of the load transistors 10 by source follower action. When source bus 20 is grounded, as the driver transistors 12 begin to conduct, regenerative action drives the sense amp $8_2$ in to the stable stage in which driver transistor $12_1$ is "on" and driver transistor $12_2$ is "off". In this state, the potential on the gates of the sense transistors 14 are such that sense transistor $14_1$ is "off" and sense transistor $14_2$ is "on". The states of the sense transistors 14 is detected by applying a potential to the output buses 21.

The terms "on" and "off" in the above description are used for brevity. In fact, with some designs, in either stable state of the sense amp $8_2$, both sense transistors 14 and both driver transistors 12 are on. In this case, for each pair of transistors, the one transistor which is on harder than the other one is considered the "on" transistor.

Manufacturing variations and tolerances determine the magnitude of the differential signals ($V_l - V_a$ and $V_0 - V_a$) required for reliable operation of the sense amps 8. According to equation 1 the factor $(qN_a/2\epsilon_s)(X_f^2 - X_i^2)$ gives the output signal from an unloaded memory cell 2'. $X_f$ can be made independent of the datum stored in the memory cell 2' by making the area of the recall electrode 5 much larger than the area of the storage electrode 3, or making $V_r$ much larger than $V_s$. Assuming that this is the case, then for an unloaded memory cell 2', the difference between a one output signal and a zero output signal is $(qN_a/2\epsilon_s)(X_0^2 - X_1^2)$, where $X_0$ is the value of $X_i$ when a zero is stored in the memory cell 2', and $X_1$ is the value of $X_i$ when a one is stored in the memory cell 2'. Increasing either $V_s$ or the substrate bias, or both, increases $X_0$. However, if $V_g$ is not sufficiently large, then $X_0$ will be limited by the extent of the depletion region beneath the gate electrode 4 when $V_g$ is applied thereto. Minimizing the leakage currents to the storage potential well and minimizing the rate at which electrons are thermally generated increases the worst case value of $X_0$. The extent of the depletion region of the residual gate potential well determines the minimum value of $X_1$. The design of the sense amp 8 also influences $X_1$ and $X_0$, since as will be described shortly, the potentials at the sources of the load transistors 10 when the sense amp $8_2$ is in it's stable states determines the surface potential of the storage potential well when datum is entered or re-entered in to the memory cell 2'.

The effect the capacitive load on the storage electrode 3 has on the output signal from the memory cell 2' is given by the factor $(1 + C_l/A_sC_0)^{-1}$ in equation 1. The difference between $V_0$ and $V_1$ is maximized by minimizing the fraction $C_l/A_sC_0$. In a memory, $C_l$ includes (1) the capacitance of the storage electrodes 3 which are connected to the storage electrode 3 of the memory cell 2' from which datum is being recalled — in the present example storage electrode $3_5$ loads storage electrode $3_6$, (2) the gate capacitance of the load transistor 10 and the source capacitance of the access transistor 16 to which the storage electrode 3 of the memory cell 2' of interest is connected, (3) the capacitance of the row bus 15 which is connected to the the storage electrode 3 of the memory cell 2' from which datum is being recalled — row bus $15_3$ in the present example.

For a particular memory, if 2) and 3) above are dominant, the area $A_s$ of the storage electrodes 3 can be increased to decrease $C_l/A_sC_0$. Increasing either the substrate bias or $V_s$ or both, decreases all three factors above, without affecting $A_sC_0$.

The access transistors 16 should be designed so that the gatesource capacitive coupling is such that the magnitude of $V_l - V_a$ is equal to the magnitude of $V_0 - V_a$.

After the sense amp $8_2$ has settled in to one of it's stable states, as determined by the datum stored in the memory cell $2'_6$, the potential on the diffused region $24_3$ is at the proper potential for re-entering the datum just recalled. If a one was recalled, the diffused region $24_3$ is at a low potential determined by the design of the sense amp $8_2$. If a zero was recalled, the diffused region $24_3$ is at a high potential — again determined by the design of the sense amp $8_2$. In either case to re-enter the datum just recalled, a potential well is formed beneath the control electrode $22_3$, by applying the potential $V_c$ to the control line $23_l$. If diffused region $24_3$ is at a low potential, a relatively large number of electrons flow from diffused region $24_3$ in to the recall potential well, and from there thru the gate potential well in to the storage potential well. If diffused region $24_3$ is at a high potential, few electrons, if any, flow from diffused region $24_3$ in to the recall potential well, and so few electrons enter the storage potential well.

In either case, after allowing sufficient time for any electron transfer to occur, the column decoder circuits bring the gate electrode $4_6$ to ground potential by grounding column line $19_2$. Then the source bus 20 is brought high, shutting off both driver transistors 12 and bringing the potential of the diffused region $24_3$ high. At this point, the potential $V_c$ can be applied to control line $23_2$. Electrons which had previously entered in to the recall potential well beneath recall electrode $5_3$ are now extracted therefrom, as electrons flow thru the potential well beneath control electrode $22_3$ to diffused region $24_3$, and from there thru load transistor $10_2$ to bus $18_2$. After a time interval sufficient to allow the surface potential of the recall potential well beneath recall electrode $5_3$ to rise to near the potential of diffused region $24_3$, the row decoders ground the recall electrodes $5_3$ and $5_4$. As the potential on the recall electrode $5_3$ drops, additional electrons are extracted from the recall potential well beneath it.

The memory is returned to the data retention mode by grounding the output buses 21, grounding the source bus 20, maintaining potential $V_c$ on both control lines 23, and turning the access transistors $16_1$ and $16_3$ on. Note that access transistors $16_1$ and $16_3$ could have been turned on as soon as the sense amp $8_2$ was in one of it's stable states.

The enter datum in memory cell $2'_6$, the address of memory cell $2'_6$ is entered in the row and column decoder circuits. Then if a one is to be entered in memory cell $2'_6$, control line $21_1$ is grounded and control line $21_2$ is kept at potential $V_c$. Then with source bus 20 grounded, the row decoders apply the potential $V_r$ to recall electrodes $5_3$ and $5_4$, and to bus $18_2$. Since $V_s$ is on the gates of both load transistors 10, both load transistors 10 turn on and begin charging up the capacitive loads at their sources. However, the transistor formed by diffused region $24_4$, control electrode $22_4$, and the recall potential well beneath the recall electrode $5_4$ augments the load transistor $10_1$ in charging up the capacitive load at the source of load transistor $10_1$. Since control electrode $22_3$ is at ground potential, load transistor $10_2$ is not assisted in charging up the capacitive load at the source of load transistor $10_2$. Therefore, the potential at the source of load transistor $10_1$ rises faster than the potential at the source of load transistorf $10_2$. Driver transistor $12_2$ turns on before driver transistor $12_1$, and by regenerative action, the sense amp $8_2$ assumes the stable state in which driver transistor $12_2$ is "on" and driver transport $12_1$ is "off". The sense amp $8_2$ is now in the same stable state that it assumes when a one is recalled from a memory cell 2' to the left of the sense amp $8_2$, and the potential on diffused region $24_3$ is low. Potential $V_c$ is now applied to control line $23_1$ and electrons from diffused region $24_3$ flow in to the recall potential well beneath recall electrode $5_3$. The column decoders apply the potential $V_g$ to column line $19_2$ and therefore to gate electrode $4_6$. Because the storage potential well of memory cell $2'_6$ is exposed to the electrons injected in to the recall potential well, regardless of the number of electrons previously contained in the storage potential well of memory cell $2'_6$, a large number of electrons now accumulate in that storage potential well. The column decoders now ground column line $19_2$ and next the potential on source bus 20 is raised so that driver transistors 12 turn off. The potential on diffused region $24_3$ rises, and excess electrons are extracted from the recall potential well beneath recall electrode $5_3$. The recall electrodes $5_3$ and $5_4$ are then brought to ground potential by the row decoders, and as the potential on bus $18_2$ falls, electrons are continuously extracted from the recall potential wells beneath the recall electrodes $5_3$ and $5_4$. If the potential on recall electrodes $5_3$ and $5_4$ falls too rapidly, electrons remaining in these recall potential wells can flow in to nearby storage potential wells and possibly destroy the data stored therein. Then source bus 20 is grounded, and the memory is returned to the data retention mode.

A similar procedure can be used to enter a zero, with the roles of control lines $23_1$ and control line $23_2$ just reversed. Provided that the area of the recall electrode 5 is much larger than the area of the storage electrode 3, a recall without re-enter can also be used to enter a zero in a particular memory cell, since under the above mentioned conditions, the recall operation automatically extracts most of the electrons in the storage potential well of the recalled memory cell 2'.

An alternative technique for setting the sense amp $8_2$ in the proper state for entering of datum is to use the gate-source capacitive coupling of the access transistors 16 to establish a difference in potential on the gate electrodes of the two load transistors 10. For example, to enter a zero in memory cell $2'_6$, control lines 23 are grounded, and the gates of access transistors $16_1$ and $16_3$ are grounded, causing the potential on the gate of load transistor $10_1$ to drop $V_s - V_a$. The potential on the gate of load transistor $10_2$ is maintained at $V_s$. Source bus 20 is brought high, and then when the row decoders apply the potential $V_r$ to recall electrodes $5_3$ and $5_4$, a difference in potential is established at the sources of the load transistors 10 such that when source bus 20 is grounded, sense amp $8_2$ turns on and settles in to the stable state in which driver transistor $12_1$ is "on" and driver transistor $12_2$ is "off". Conversely, to enter a one in memory cell $2'_6$, control lines 23 are grounded and the gates of access transistors $16_2$ and $16_4$ are grounded. Source bus 20 is then brought high and when the row decoders apply potential $V_r$ to the recall electrodes $5_3$ and $5_4$, a difference in potential is established at the sources of the load transistors 10 such that when source bus 20 is grounded, the sense amp $8_2$ settles in to the stable state in which driver transistor $12_2$ is "on" and driver transistor $12_1$ is "off".

After the sense amp $8_2$ is properly set, potential $V_g$ is applied to gate electrode $4_6$. From this point on, the procedure is the same as that used in the enter datum operation in which the control lines 23 are used to set the sense amp $8_2$.

The read-modify-write operation is a straightforward combination of a recall operation, followed by grounding the addressed recall electrode 5, setting the state of the sense amp 8 serving the memory cell 2' of interest by either of the techniques previously described, and then performing an enter operation.

Due to leakage currents and the thermal generation of electrons, a periodic refresh is required. The refresh operation consists of a recall operation followed by a re-enter operation. Note that a column of memory cells 2' can be refreshed simultaneously. If more than one memory cell 2' is refreshed at a time, then during the refresh operation output buses 21 cannot be used to determine the datum stored in the memory cells 2'.

During all operations other than refreshing a column of memory cells 2', only one memory cell 2', the addressed memory cell, has both potential $V_r$ applied to it's recall electrode 5 and has potential $V_g$ applied to it's gate electrode 4. Therefore data in the non-addressed memory cells 2' is not destroyed by recalling datum from, and entering or re-entering datum in to the addressed memory cell 2'. However, during the recall operation, the memory cells 2' in the same column as the addressed memory cell 2' have the potential $V_g$ applied to their gate electrodes 4. While these non-addressed memory cells 2' have their gate electrodes 4 activated, electrons from the residual recall potential wells of these memory cells 2' can flow in to the storage potential wells of these memory cells 2'. To minimize the time interval during which the gate electrodes 4 are activated, the column decoders can be designed to apply the potential $V_g$ to the addressed column line 19 only for the time interval required for the transfer of electrons from the storage potential well to the recall potential well of the addressed memory cell 2'. Then while the sense amp is settling and the sense transistor 13, 14 are being interrogated, the gate electrodes 4 of all the memory cells 2' are at ground. When datum is to be re-entered, the potential $V_g$ is again applied to the addressed column line 19 only long enough for any transfer of electrons from the recall potential well to the storage potential well of the addressed memory cell 2', to occur. Then all the gate electrodes 4 are again grounded.

The second method of recalling datum from a memory cell that was described when the memory cell 2 of FIGS. 1 and 2 was considered can also be used with the memory shown in FIG. 4. Using this second recall method, the recall operation described for the memory of FIG. 4 is modified so that potential $V_g'$ and not potential $V_g$ is applied to the gate 4 of the memory cell 2' from which datum is being recalled. The requirements on the potential $V_g'$ have been described previously. Then if a one is recalled from the memory cell 2', the potential $V_s - V_a + V_1'$ which is greater than $V_s$ is applied to the gate of one of the load transistors 9, 10. If a zero is recalled from a memory cell 2' the potential $V_s - V_a$, which is less than $V_s$ is applied to the gate of one of the load transistors 9, 10. The response of the sense amp $8_1$, $8_2$, as appropriate, is similar to what has been previously described.

When entering new datum in a memory cell 2', the potential $V_g$ and not $V_g'$ is applied to the gate 4 of the memory cell 2'. When re-entering the datum which has just previously been recalled from a memory cell 2' either $V_g$ or $V_g'$ can be applied to the gate electrode 4 of that memory cell 2'. The technique described above, wherein during the recall operation, the gate electrode 4 is activated only for a time interval sufficient for charge transfer between the storage and recall potential wells, can equally well be used when this second recall method is used.

To maximize the output signal from the memory cell 2′ when datum is being recalled, the potential $V_s$ should be as large as possible. However, if enhancement mode FETs with threshold voltages of $V_{th}$ are used for the access transistors 16, the potential $V_s$ is limited by the requirement that if $V_{max}$ is the maximum potential that can be used in the memory, then $V_s$ must be less than $V_{max} - V_{th}$. If depletion mode FETs with sufficiently large resistances between their source and drain when the gate is at ground potential, are used for the access transistors, then $V_s$ can be equal to $V_{max}$. The requirement for such depletion mode transistors to be acceptable to use as access transistors 16 is that the resistance R between the source and drain when the gate is at ground, must be sufficiently large that the time constant $RC_1$ ($C_1$ has been defined when it appeared in eq. 1) is much larger than the response time of the sense amp 8.

To recall datum from, enter or re-enter datum in to, or refresh the datum being stored in a memory cell 2′ to the right of the sense amps 8, procedures similar to those described above for performing these operations on a memory cell 2′ to the left of the sense amps 8 can be used. Note however, that the interpretation of the states of the sense transistors 13 and 14 depends on which side of the sense amps 8 the memory cell 2′ is located.

A particular sequence of operations has been described by which datum can be recalled from, and entered or re-entered in to a memory cell 2′ in the memory shown in FIG. 4. The characteristics of the support circuitry required for the operation of the memory have not been considered. When these characteristics are taken into consideration, it may be advantageous to modify the particular sequence described above. It is understood that this invention is not limited to the exact sequence of operations described above.

As was perviously explained, if standard silicon gate technology is used to manufacture the memory shown in FIG. 4, the diffused regions 24 which pass beneath the row lines 15 present a problem. FIG. 5 shows how the memory of FIG. 4 can be modified so that the memory can be more easily manufactured with silicon gate technology. In FIG. 5 the diffused region 24 is adjacent to a second gate 25 which is connected to row bus 15. Since a potential near $V_s$ is always maintained on the row bus 15, a potential well is always formed beneath the second gate 25. Therefore when potential $V_c$ is applied to control electrode 22, electrons can flow between the diffused region 24 and the recall potential well. A memory similar to that shown in FIG. 4 but with the modifications shown in FIG. 5 can be operated in a manner very similar to that used in the operation of the memory of FIG. 4. The modification does introduce a negative feedback to the sense amp 8 during the recall operation, and therefore the sense amp 8 is made less sensitive. By minimizing the area of the second gate 25, this negative feedback can be minimized.

In practical memories, to minimize the total surface area required for the memory, the number of memory cells per sense amp should be maximized. However, as the number of memory cells per subrow is increased, $C_1$ increases, and when datum is recalled, the output signal ffrom the memory cells is reduced. FIG. 6 shows a sense amp 8′ which is similar to the sense amp 8 of FIG. 4, but which has been modified so that the number of memory cells 2′ per sense amp can be increased without increasing the capacitive load on the storage electrodes 3.

In the sense amp 8′ of FIG. 6, four load transistors $9'_1$, $9'_2$, $9'_3$, and $9'_4$ are provided. One access transistor is provided for each subrow of memory cells 2′, so that during the recall operation, the memory cell 2′ from which datum is being recalled is not loaded by the storage electrodes 3 of the memory cells 2′ which are not in the same subrow as the memory cell 2′ from which datum is being recalled. No two memory cells 2′ which are served by the same sense amp 8′ are connected to the same column line 19. When recalling the datum from a memory cell 2′ served by this sense by this sense amp 8′, all the access transistors on either the left or the right side of the sense amp 8′ are turned off, the row decoders apply the potential $V_r$ to all four recall electrodes 5, and the column decoders apply the potential $V_g$ to one column line 19 and therefore to the gate 4 of one of the memory cells 2′ served by this sense amp 8′. Therefore the output signal from the addressed memory cell 2′ — either $V_s - V_a + V_l$ or $V_s - V_a + V_o$ — appears on the gate electrode of only one of the load transistors 9′. In most other respects, the operation of this sense amp 8′ and the operation of a memory in which these sense amps 8′ are used is very similar to what has been described when the memory shown in FIG. 4 and the sense amps 8 were considered. Therefore the details need not be presented here.

The basic idea of this modification can be applied to devise sense amps with six, eight, or more load transistors. But topological restrictions and the increase in capacitance due to the interconnections required for such sense amps imposes practical limits on such extensions.

Although emphasis has been placed on the use of the present invention to recall the datum stored in one particular memory cell in a memory, this invention can also be used to advantage in memories in which the datum stored in a plurality of memory cells is to be recalled simultaneously. When recalling datum from a plurality of memory cells simultaneously, no two of the memory cells from which datum is being recalled can be in the same row. Also in recalling data from a plurality of memory cells, in those rows of memory cells in which the recall electrodes are activated, no more than one gate electrode can be activated. The above requirements are easily met if the memory cells from which data is being recalled are all in the same column and are all in the same column and are all in different rows. Of course, a seperate pair of output buses from the sense transistors must be provided for each of the plurality of sense amps used in simultaneously recalling data from a plurality of memory cells.

What I claim is:

1. In the class of semiconductor random access memory arrays wherein a plurality of memory cells are disposed in rows and columns, and each of said memory cells is provided with no more than three electrodes, and wherein in each of said memory cells a first electrode in proximity to and insulated from a semiconducting substrate is utilized to form in said semiconducting substrate a first potential well for mobile charge carriers of one polarity, and wherein in each of said memory cells binary datum is represented by the density of mobile charge carriers of said polarity which are stored in the said first potential well of the said memory cell, a method of destructively recalling the value of the binary datum stored in said memory cells, comprising the steps of selecting one of said rows of memory cells, utilizing a second electrode in proximity to and insulated from said semiconducting substrate to form in said semiconducting substrate a second potential well for said polarity of mobile charge carriers, said second potential well being in close proximity to and distinct from each of the said first potential wells of the said memory cells in the said selected row, selecting from said selected row of memory cells, one particular memory cell, utilizing a third electrode in proximity to and insulated from said semiconducting substrate to form in said semiconducting substrate a third potential well for said polarity of mobile charge carriers, said third potential well being disposed with respect to both the said first potential well of said one particular memory cell and the said second potential well, that said third potential well forms a channel for mobile charge carriers of said polarity, said channel connecting said first potential well of said one particular memory cell and said second potential well, said second and said third potential wells being such that through said channel some fraction of any mobile charge carriers of said polarity stored in the said first potential well of said one particular memory cell, transfer to the said second potential well, and detecting on the said first electrode of the said one particular memory cell, any potential change resulting from said transfer of charge carriers.

2. In the class of semiconductor random access memory arrays wherein a plurality of memory cells are disposed in rows and columns and each of said memory cells is provided with no more than three electrodes, and wherein in each of said memory cells, a first electrode in proximity to and insulated from a semiconducting substrate is utilized to form in said semiconducting substrate a first potential well for mobile charge carriers of one polarity, and wherein in each of said memory cells, a one is represented by storing a relatively large number of said polarity of mobile charge carriers in said first potential well of said memory cell, and a zero is represented by storing a relatively small number of said polarity of mobile charge carriers in said first potential well of said memory cell, a method of destructively recalling the value of the binary datum stored in said memory cells, comprising the steps of selecting one of said rows of memory cells, utilizing a second electrode in proximity to and insulated from said semiconducting substrate to form in said semiconducting substrate, a second potential well for said polarity of mobile charge carriers, said second potential well being in close proximity to and distinct from each of the said first potential wells of the said memory cells in the said selected row, selecting from said selected row of memory cells, one particular memory cell, utilizing a third electrode in proximity to and insulated from said semiconducting substrate to form in said semiconducting substrate a third potential well for said polarity of mobile charge carriers, said third potential well being disposed with respect to both the said first potential well of said one particular memory cell and the said second potential well, that said third potential well forms a channel for mobile charge carriers of said polarity, said channel connecting said first potential well of said one particular memory cell and said second potential well, said second and said third potential wells being such that if a one is stored in the said one particular memory cell, a first fraction of the said mobile charge carriers which were stored in the said first potential well of the said one particular memory cell transfer to the said second potential well, and if a zero is stored in the said one particular memory cell, a second fraction of any of the said mobile charge carriers which were stored in the said first potential well of the said one particular memory cell transfer to the said second potential well, said first fraction being larger than said second fraction, and detecting on the said first electrode of the said one particular memory cell, any potential change resulting from said transfer of charge carriers.

* * * * *